United States Patent [19]

Agiman

[11] Patent Number: 5,055,888
[45] Date of Patent: Oct. 8, 1991

[54] ZENER DIODES IN A LINEAR SEMICONDUCTOR DEVICE

[75] Inventor: Dan Agiman, Lewisville, Tex.

[73] Assignee: Texas Instrumenets Incorporated, Dallas, Tex.

[21] Appl. No.: 370,207

[22] Filed: Jun. 21, 1989

[51] Int. Cl.[5] .......................................... H01L 29/90
[52] U.S. Cl. ...................................... 357/13; 357/20; 357/21
[58] Field of Search ................... 357/13, 21; 437/973; 148/DIG. 174

[56]          References Cited
       U.S. PATENT DOCUMENTS

| 4,155,777 | 5/1979 | Dunkley et al. | 357/20 |
| 4,405,933 | 9/1983 | Avery | 357/13 |
| 4,631,562 | 12/1986 | Avery | 357/13 |
| 4,651,178 | 3/1987 | Avery | 357/13 |

FOREIGN PATENT DOCUMENTS

| 3609629 | 10/1986 | Fed. Rep. of Germany | 357/13 |
| 0020476 | 2/1982 | Japan | 357/13 R |
| 0085266 | 5/1982 | Japan | 357/13 Z |
| 0218878 | 11/1985 | Japan | 357/13 Z |
| 0270875 | 12/1986 | Japan | 357/13 |
| 0021279 | 1/1987 | Japan | 357/13 |

Primary Examiner—Rolf Hille
Assistant Examiner—Minhloan Tran
Attorney, Agent, or Firm—B. Peter Barndt; James T. Comfort; Melvin Sharp

[57]          ABSTRACT

A Zener diode structure comprising a semiconductor substrate layer of a first conductivity type, a first epitaxially formed semiconductor layer of the first conductivity type disposed on the substrate layer, a second epitaxially formed semiconductor layer of a second conductivity type disposed on the first semiconductor layer, a third semiconductor layer of the first conductivity type disposed over the second semiconductor layer, a buried layer of the first conductivity type disposed between and contacting the second and third semiconductor layers and a semiconductor contact region of the second conductivity type extending between and contacting a surface of the third semiconductor layer and the buried layer, the semiconductor contact region being an anode of a Zener diode, the buried layer being a cathode of the Zener diode.

7 Claims, 3 Drawing Sheets

ZENER DIODES IN A LINEAR SEMICONDUCTOR DEVICE

STATEMENT OF RELATED CASES

This application is related to Ser. No. 309,514, Ser. No. 309,515, now abandoned, Ser. No. 309,452, now abandoned and Ser. No. 370,357, now abandoned.

BACKGROUND OF THE INVENTION

I. Field of the invention

The present invention relates generally to semiconductor integrated devices and, more particularly, to a method for fabricating Zener diodes in said devices.

II. Description of the related art

Smart power integrated circuit (IC) transistors generally combine logic and power transistor devices on the same semiconductor chip. Such smart power ICs are fabricated by Texas Instrument's Inc., according to a novel multi-epitaxial linear process. The power and logic devices included on these ICs are circuit connected to provide desired operating functions. An example of one such circuit is the high-side driver. High-side drivers are often expected to deliver considerable amounts of drive current to external loads. When used in the automotive industry, such loads typically include lamps, motors, transformer primaries, and other forms of inductive loads.

There are numerous advantages to having an integrated high-side driver. Having control circuitry on board with the power circuitry allows for easy current and temperature sensing for self protected devices. The ICs can also incorporate protection from reverse battery conditions, lost of battery and other conditions which previously had to be dealt with externally. Even with the above benefits such circuits are deficient in their ability to drive inductive loads. A specific problem is that, when driving inductive loads, any interruption in drive current will cause the output structure to develop Vce voltages which may exceed the IC device rating. As a result, the power transistor may be destroyed by driving it into secondary breakdown. Thus it is apparent that a transient protection mechanism for preventing potential destruction of the device in a shorted load or a transient load condition is desired.

To be most beneficial the incorporation of such mechanism should be completely compatible with the process for fabricating the integrated circuit in order to achieve full integration on the chip. Such mechanism should have versatility in its voltage handling characteristics in order to allow for design flexibility of the IC. Additionally, such mechanism should be manufacturable in different embodiments to allow even greater design flexibility.

SUMMARY OF THE INVENTION

The present invention provides a method for fabricating Zener diodes which satisfy the above and other desired characteristics of a transient protection mechanism. The Zener diodes constructed in accordance with the present teachings are fully compatible with an existing multi-epitaxial linear transistor process. Briefly, in one embodiment, the present device comprises a semiconductor substrate layer having a first conductivity type;

a first semiconductor layer having said first conductivity type epitaxially formed on said substrate layer;

a second semiconductor layer having a second conductivity type epitaxially formed on said first semiconductor layer;

a third semiconductor layer having said first conductivity type formed over said second semiconductor layer;

a buried layer having said first, conductivity type disposed between said and contacting said second and third semiconductor layers; and a semiconductor contact region having said second conductivity type extending between and contacting a surface of said third semiconductor layer and said buried diffusion under film layer, said semiconductor contact region forming an anode for a Zener diode, said diffusion under film layer forming a cathode for said Zener diode.

The novel features which characterize the present invention are defined by the appended claims. The foregoing and other features, benefits, advantages and embodiments of the invention will hereinafter become apparent. For purposes of illustration only, and not of limitation, preferred embodiments are depicted in the accompanying drawings and described hereinafter.

BRIEF DESCRIPTION OF THE DRAWINGS

Further features and advantages and variations of the present invention will become more apparent from the following and more particular and detailed description of the invention, when read in view of the following drawing figures, wherein.

For ease of illustration, all diffusions are assumed to be complete in the designated cross section, whereas in reality certain diffusions are interrupted for other implants or depositions and may not be complete until subsequent thermal cycles are completed.

DETAILED DESCRIPTION OF THE PREFERRED EMBODIMENTS

Figure 1:
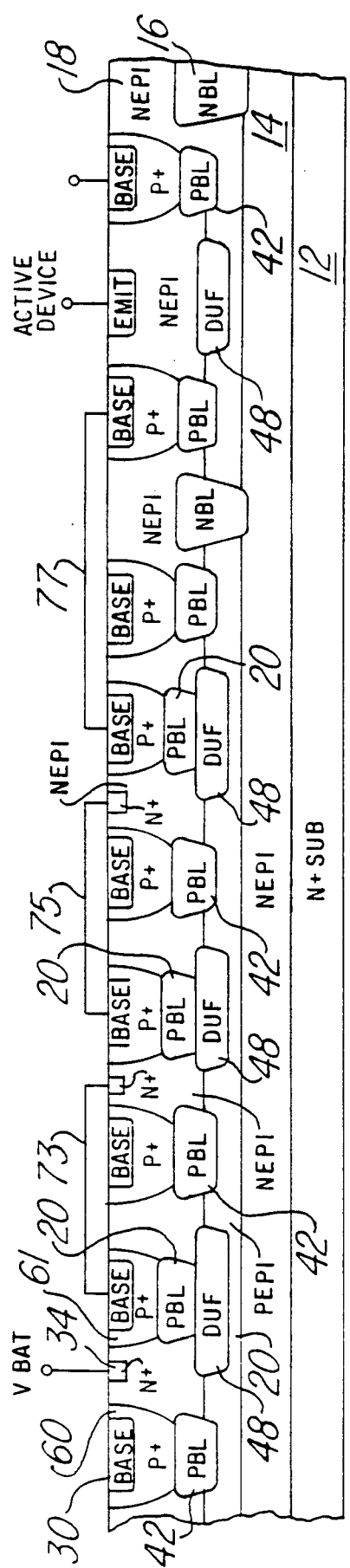
FIG. 1 is a wafer cross section diagram of a multi-epitaxial wafer depicting an embodiment of the present invention.

Referring now to the drawings, wherein like reference characters designate like or corresponding parts throughout the several views, FIG. 1 depicts a schematic cross-section of an embodiment of the present invention. For purposes of simplicity FIG. 1 depicts only part of a full semiconductor wafer as used in accordance with the teachings of the present invention. The structure of FIG. 1 comprises a semiconductor wafer or substrate 12 of a <100> crystal orientation. The wafer 12 is N-type doped, and has a resistivity of approximately 0.01 to 0.02 ohm-cm. A first N-type epitaxial (epi) layer 14 is formed on a surface of wafer 12. Epitaxial layer 14 may be deposited or grown on wafer 12 by conventional and well known methods such as batch reactor, continuous or metal oxide chemical vapor deposition, molecular beam epitaxy, etc. After formation of the first N-type epitaxial layer 14, a P-type epitaxial layer 20 is thereafter grown in a manner similar to the formation of epitaxial layer 14.

Thereafter the surface of the wafer is oxidized, patterned and etched to expose regions (not shown) in the oxide (not shown) in preparation for formation of N type buried layers (NBL) or isolation regions 16. The NBL regions are formed by an N-type implant such as a phosphorus implant dose (not shown) of approximately 8.0E14 atoms per-cm$^2$ at 80 KeV through a 500A pre-implant oxide (not shown) formed in the exposed regions. The wafer is thereafter subjected to a nitrogen diffusion and steam cycle. During processing the NBL regions 16 diffuse down sufficiently to completely penetrate P-epi 20 and thereby provide isolation to separate P-epi 20 into various regions.

Thereafter the wafer is again photolithographically patterned and exposed to form regions (not shown) whereat P-type buried layers 42, referred to herein as PBLs, will be formed in the P-epitaxial layer 20. The PBLs are formed by a P-type implant such as a boron implant dose of approximately 20.14 atoms per-cm$^2$ at 60 KeV through a 825A pre-implant oxide formed on the surface of exposed epi layer 20. The boron implant is followed by a nitrogen diffusion and a steam cycle.

In one embodiment of the invention, PBL regions 42 are formed to provide isolation and separation of a N-type epitaxial layer 18 which will be formed over P-type epitaxial layer 20. PBL regions 42 up-diffuse during processing to join with down diffusing P+ regions 60 which will be formed in the third N-type epitaxial layer 18 as described hereinafter. In other embodiments PBL regions 21 are used as a P region anode of a Zener diode fabricated in accordance with the present invention.

Next the wafer is patterned (not shown) and exposed to form openings whereat buried Diffusion Under Film or DUF regions 48 are formed in the wafer. The DUF regions are fabricated using an N-type implant such as an antimony implant at a dose of approximately 1.0E15 atoms per-cm$^2$ at 60 KeV energy followed by a diffusion steam cycle. The DUF regions 48 when formed beneath PBL regions 21 are used in the present invention as cathode regions of Zener diodes formed in accordance with the present invention. Of course when forming PBLs 21 to sit on DUF regions 48 separate masking and/or implants will occur. It should also be noted that although the separate implant regions, such as 21 and 48, are depicted as having distinct boundaries with respect to one another, they may in fact have overlapping or merged boundaries.

After the steam cycle, the photoresist material and oxide are removed and a third, N-type epitaxial layer 18 is grown over second P-type epitaxial layer 20. Epitaxial layer 18 is formed in a manner similar to formation of epi layers 14 and 20.

Individual epitaxial tank isolation and completion of the anode component of the Zener diodes is achieved by the formation of P+ isolation regions 60 in the surface of N-type epitaxial layer 18. The P+ isolation regions are formed by a P-type surface deposition such as a boron deposition. The second N-type epitaxial surface is first thermally oxidized and the P+ regions are photolithographically defined (not shown). In one embodiment the P+ regions 60 will coincide with the previously defined PBL regions 42 for device isolation; or directly over previously defined PBL regions 21 for formation of Zener diodes. The P+ regions 60 are formed through a BBr3 thermal deposition at 1100C followed by a 1200C diffusion cycle.

Thereafter boron implant regions referred to herein as BASE regions 30, are formed by implanting a boron dose of 6.5E14 atoms per cm$^2$ in photolithographically patterned and exposed areas. The implant is followed by a nitrogen diffusion and a steam cycle. BASE regions may be formed wholly within the P+ isolation regions or such that they extend beyond the regions as desired for a particular diode or isolation purpose.

Thereafter photoresist material (not shown) is again patterned and etched and fabrication of N+ contact regions 34 is completed with a deposition and diffusion anneal of phosphorus regions 78. In one embodiment (FIG. 2 in phantom) these N+ regions may extend downward into the wafer to contact an underlying DUF region. Thus providing a low resistance contact.

The Zener diodes depicted in FIG. 1 and fabricated as disclosed above have reverse voltages between approximately 15-25 volts. The present process steps for incorporating the Zener diodes into an integrated circuit is completely compatible with the process and structures disclosed in U.S. patent applications Ser. No. 309,515 filed Feb. 10, 1989 and Ser. No. 07/370,357 filed June 21, 1989, both assigned to Applicant's assignee. The contents of said applications are hereby incorporated herein by reference. As shown in FIG. 1 a plurality of the present Zener diodes can be cascaded together to provide in essence a single diode having a sum of the peak inverse operating voltages of the individual diodes.

Figure 2:
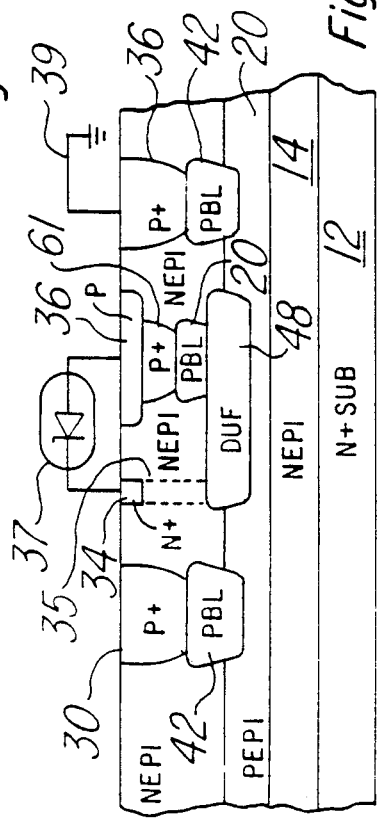
FIG. 2 is a wafer cross section diagram of a multi-epitaxial wafer depicting another embodiment of the present invention.

Referring now to drawing FIG. 2, there is depicted an alternative embodiment of the present invention wherein DUF region 48 extends laterally away from PBL region 21 and is situated beneath the N+ contact. Additionally the P+ BASE diffusion 36 is depicted overlapping P+ region 60. It should be noted that the various individual variations such as extending the N+ contact to the DUF or extending the size of a P BASE region 36 are not limited to the particular structure depicted in the drawings. Thus for example enlarged region 36 may be employed in the other structures.

Figure 3:
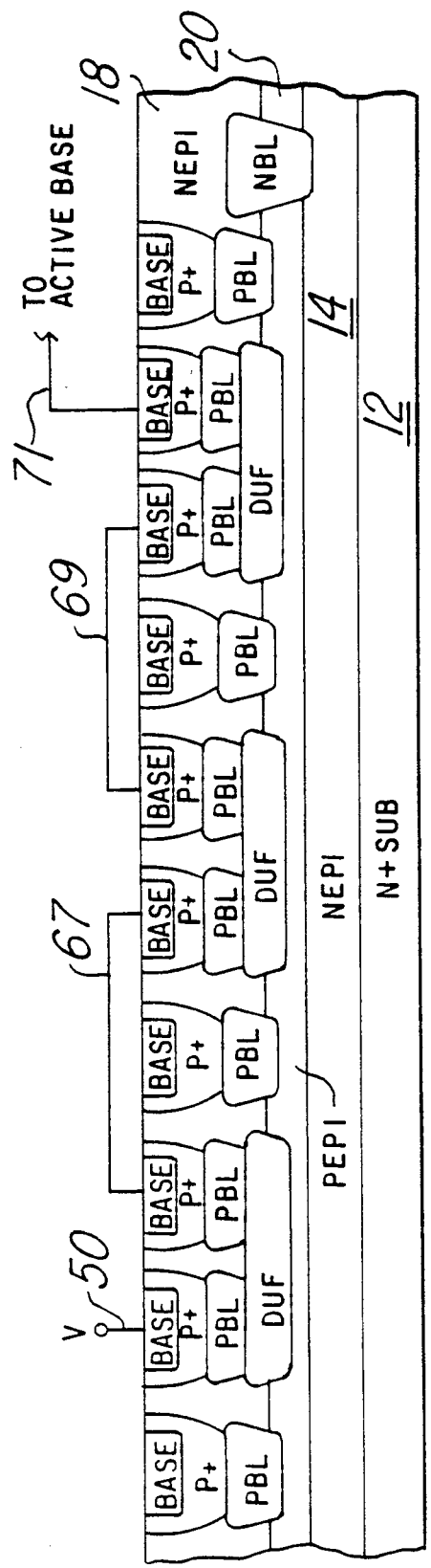
FIG. 3 is a wafer cross section diagram of another embodiment of the present invention.

Referring now to drawing FIG. 3 a P+/PBL/DUF zener diode implementation is depicted. In this embodiment there is no need to utilize the N+ diffusion areas in order to achieve zener diode connection. With this embodiment, bidirectional zener diode operation can be achieved for protection of the designed IC circuit.

Figure 4:
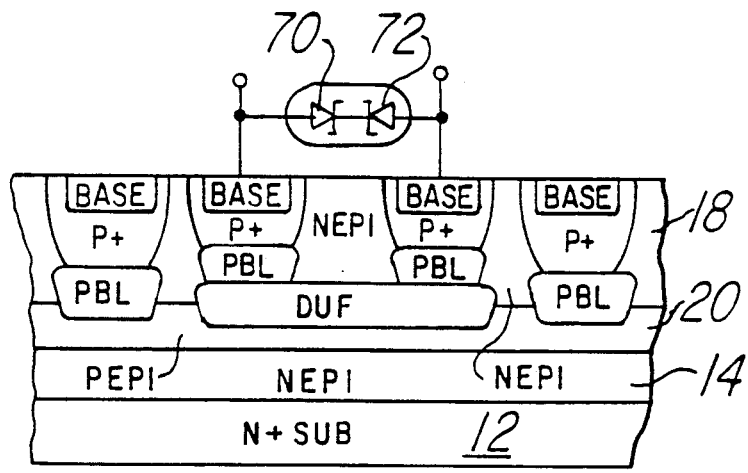
FIG. 4 illustrates functionally the Zener diode connection of the FIG. 3 embodiment.

Referring now to drawing FIG. 4, a cut out section of the FIG. 3 wafer is depicted. The cut out shows the functional disposition of the cascadable bidirection diodes 70, 72 of the FIG. 3 embodiment. With reference again to drawing FIG. 2, a cut out section of the FIG. 1 wafer is depicted. Zener diode 37 illustrates the functional disposition of the previously discussed diodes.

Figure 5:
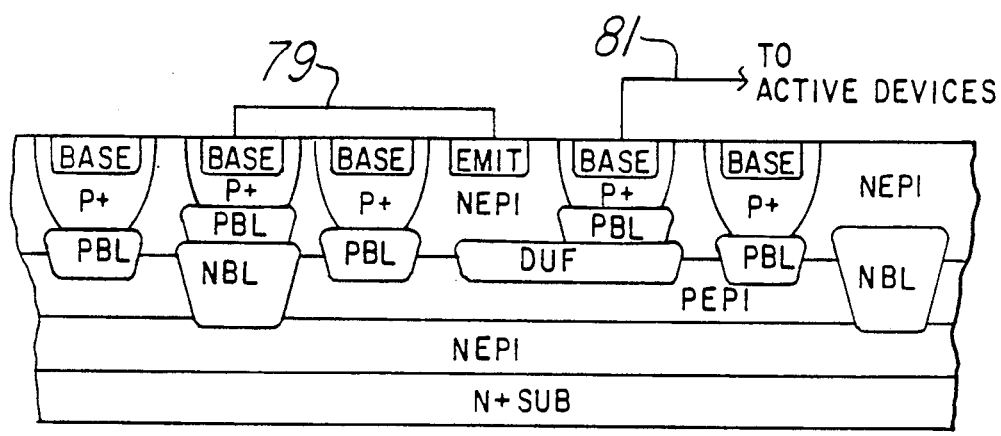
FIG. 5 is a wafer cross section diagram of another embodiment of the present invention.

Drawing FIG. 5 illustrates an NBL/PBL/P+ Zener diode and a P+/PBL/DUF Zener diode cascade implementation of the present invention. In this manner various voltage levels of zener diodes can be designed. For example, for the NBL/PBL/P+ forms a 40 to 60 volts zener and the P+/PBL/DUF form. approximately a 20 volt Zener diode.

TECHNICAL ADVANTAGES OF THE INVENTION

From the foregoing, a novel method for fabricating Zener diodes in a multi-epitaxial semiconductor device structure has been disclosed. A major and foremost technical advantage of the present diodes is that they can be constructed in a linear device process. Zener diodes cannot be fabricated in this manner in conventional linear processes. Another attendant technical advantage of the present invention is that fabrication of the Zener diodes is completely compatible with the existing process steps in the manufacture of multi-epitaxial structure. Another technical advantage is that Zener diodes having break down voltages between 15 and 70 volts can be fabricated, thus allowing versatility in the use thereof in the design of electronic circuits. Yet another technical advantage of the present method and the resulting structures is that the diodes can be isolated in individual epi-tanks and can additionally be cascaded for summing of break down voltage. Yet still another technical advantage of the present invention is that an embodiment can be constructed which allows bidirectional diode action.

The values and ranges discussed herein are given for a preferred embodiment of the present invention. Of course these values may vary as the parameters are changed. For example, in the preferred embodiments detailed hereinbefore photolithographic techniques are used for patterning and etching. However, one of ordinary skill in the art would recognize that other techniques of patterning and etching can be employed, such as E-beam and X-ray lithography. Therefore, it is to be understood that many changes in detail may be made as a matter of engineering choices without departing from the spirit and scope of the invention, as defined by the appended claims.

It is an expected and intended use of the present integrated circuit device that it be operatively interconnected to construct electronic circuit devices capable of providing needed functions in automotive electronics, computer-peripheral applications, motor control circuits for electronic cameras, etc.

What is claimed is:

1. A Zener diode structure comprising:
   (a) a semiconductor substrate layer of a first conductivity type;
   (b) a first epitaxial semiconductor layer of said first conductivity type disposed on said substrate layer;
   (c) a second epitaxial semiconductor layer of a second conductivity type different from said first conductivity type disposed on said first semiconductor layer;
   (d) a third epitaxial semiconductor layer of said first conductivity type disposed over said second semiconductor layer;
   (e) a buried layer of said first conductivity type disposed between and contacting said second and third semiconductor layers; and
   (f) a semiconductor contact region of said second conductivity type extending between and contacting a surface of said third semiconductor layer and said buried layer to provide a Zener diode therewith, said semiconductor contact region being an anode of said Zener diode and said buried layer being a cathode of said Zener diode.

2. The Zener diode structure of claim 1, wherein said diode has a reverse breakdown voltage in the range between 15 and 25 volts.

3. The Zener diode structure of claim 1, further comprising a contact surface layer of said second conductivity type contiguous to a surface of said semiconductor contact region.

4. A semiconductor structure having a plurality of isolated Zener diodes comprising:
   (a) a semiconductor substrate layer of a first conductivity type;
   (b) a first epitaxial semiconductor layer of said first conductivity type disposed on said substrate layer;
   (c) a second epitaxial semiconductor layer of a second conductivity type different from said first conductivity type disposed on said first semiconductor layer;
   (d) a third epitaxial semiconductor layer of said first conductivity type disposed over said second semiconductor layer;
   (e) at least two buried layers of said first conductivity type disposed between and contacting said second and third semiconductor layers;
   (f) a semiconductor contact region of said second conductivity type corresponding to each of said buried layers, each of said contact regions extending between and contacting a surface of said third semiconductor layer and one of said buried layers to provide a Zener diode therewith, each of said semiconductor contact regions being an anode of the associated Zener diode, each of said buried layers being a cathode of the associated Zener diode;
   (g) a contact having a doping concentration greater than said contact region corresponding to each of said semiconductor contact regions and of said first conductivity type; and
   (h) semiconductor isolation regions isolating a semiconductor contact region and a corresponding contact from adjacent semiconductor contact regions and a corresponding contact.

5. The Zener diode structure of claim 4, further comprising a contact surface layer of said second conductivity type contiguous to a surface of said semiconductor contact region.

6. The Zener diode structure of claim 4, wherein said buried region extends laterally away from its corresponding semiconductor contact region and is disposed beneath a corresponding contact.

7. A cascaded Zener diode structure comprising:
   (a) a semiconductor substrate layer of a first conductivity type;
   (b) a first epitaxial semiconductor layer of said first conductivity type disposed on said substrate layer;
   (c) a second epitaxial semiconductor layer of a second conductivity type different from said first conductivity type disposed on said first semiconductor layer;
   (d) a third epitaxial semiconductor layer of said first conductivity type disposed on said second semiconductor layer;
   (e) a buried layer of said first conductivity type disposed between and contacting said second and third semiconductor layers; and
   (f) first and second semiconductor contact regions of said second conductivity type extending between and contacting a surface of said third semiconductor layer and said buried layer to provide first and second Zener diodes therewith, said first semiconductor contact region being an anode of said first Zener diode, said second semiconductor contact region being an anode of said second Zener diode, said buried layer concurrently being cathode of said first Zener diode and a cathode of said second Zener diode.

* * * * *